United States Patent [19]
Everett et al.

[11] Patent Number: 5,808,742
[45] Date of Patent: Sep. 15, 1998

[54] OPTICAL ALIGNMENT APPARATUS HAVING MULTIPLE PARALLEL ALIGNMENT MARKS

[75] Inventors: Patrick N. Everett, Concord; Euclid Eberle Moon, Boston; Henry I. Smith, Sudbury, all of Mass.

[73] Assignee: Massachusetts Institute of Technology, Cambridge, Mass.

[21] Appl. No.: 654,287

[22] Filed: May 28, 1996

Related U.S. Application Data

[63] Continuation-in-part of Ser. No. 455,325, May 31, 1995, abandoned.

[51] Int. Cl.$^6$ .................................................. G01B 9/02
[52] U.S. Cl. ........................................... 356/363; 356/401
[58] Field of Search .................................. 356/356, 363, 356/401; 250/548

[56] References Cited

U.S. PATENT DOCUMENTS

| | | | |
|---|---|---|---|
| 4,200,395 | 4/1980 | Smith et al. | 356/356 |
| 4,340,305 | 7/1982 | Smith et al. | 356/356 |
| 4,848,911 | 7/1989 | Uchida et al. | 356/363 |
| 5,000,573 | 3/1991 | Suzuki et al. . | |
| 5,235,408 | 8/1993 | Matsugu et al. | 356/401 |
| 5,414,514 | 5/1995 | Smith et al. | 356/363 |
| 5,559,598 | 9/1996 | Matsumoto . | |

FOREIGN PATENT DOCUMENTS

| | | |
|---|---|---|
| 151032 | 8/1985 | European Pat. Off. . |
| 323242 | 7/1989 | European Pat. Off. . |
| 7-208923 | 8/1995 | Japan . |

OTHER PUBLICATIONS

Moon et al., Journal of Vacuum Science & Technology, "Immunity to single degradation by overlayers using a novel spatial–phase–matching alignment system", vol. 13, No. 6, pp. 2648–2652, Nov./Dec., 1995.

Moel et al., Journal of Vacuum Science & Technology, "Novel on–axis interferometric alignment method with sub–10 nm precision", vol. 11, No. 6, pp. 2191–2194, Nov./Dec., 1993.

*Primary Examiner*—Samuel A. Turner
*Attorney, Agent, or Firm*—Samuels, Gauthier, Stevens & Reppert

[57] ABSTRACT

Alignment marks on first and second plates include a plurality of periodic gratings. A grating on a first plate has a period or pitch $p_1$ paired up with a grating on the second plate that has a slightly different period $p_2$. A grating on the first plate having a period $p_3$ is paired up with a grating on the second plate having a slightly different period $p_4$. Illuminating the gratings produces a first interference pattern characterized by a first interference phase where beams diffracted from the first and second gratings overlap and a second interference pattern characterized by a second interference phase where beams diffracted from the third and fourth gratings overlap. The plates are moved until the difference between the first and second interference phases correspond to a predetermined interference phase difference.

Further invention uses an interrupted-grating pattern on the second plate with certain advantages. Further advantages are obtained using a checkerboard pattern on the second plate. In addition two inventions are made for measuring gap. One method uses the same marks on the second plate as used in aligning, and the second uses no marks on the second plate, which is an advantage in some cases.

15 Claims, 18 Drawing Sheets a) Checkerboard pattern 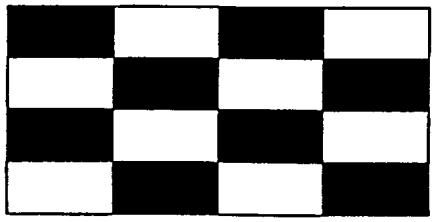 b) Interrupted grating pattern 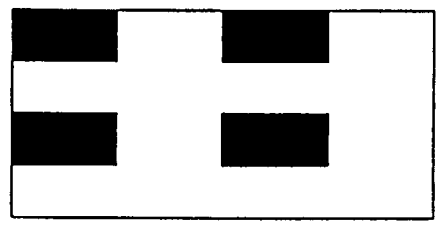
FIG. 16 a) FT of checkerboard pattern

| 20 | 0 | 0 | 0 | 0 | 0 | 0 | 0 | 0 | 0 | 0 | 0 | -0 | -0 | 0 | 0 |
|----|---|---|---|---|---|---|---|---|---|---|---|----|----|---|---|
| 0 | 0 | 0 | 0 | 0 | 0 | 0 | 0 | 0 | 0 | 0 | 0 | 0 | 0 | 0 | 0 |
| 0 | 0 | 8 | 0 | 0 | 0 | 3 | 0 | 0 | 0 | 2 | 0 | 0 | 0 | 2 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 3 | 0 | 0 | 0 | 1 | 0 | 0 | 0 | 1 | 0 | 0 | 0 | 1 | 0 |
| 0 | 0 | 0 | 0 | 0 | 0 | 0 | 0 | 0 | 0 | 0 | 0 | 0 | 0 | 0 | 0 |

FIG. 17A b) FT of interrupted-grating pattern

| 10 | 0 | 6 | 0 | 0 | 0 | 2 | 0 | 0 | 0 | 2 | 0 | -0 | -0 | 1 | 0 |
|----|---|---|---|---|---|---|---|---|---|---|---|----|----|---|---|
| 0 | 0 | 0 | 0 | 0 | 0 | 0 | 0 | 0 | 0 | 0 | 0 | 0 | 0 | 0 | 0 |
| 7 | 0 | 4 | 0 | 0 | 0 | 1 | 0 | 0 | 0 | 1 | 0 | 0 | 0 | 1 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 3 | 0 | 2 | 0 | 0 | 0 | 1 | 0 | 0 | 0 | 1 | 0 | 0 | 0 | 1 | 0 |
| 0 | 0 | 0 | 0 | 0 | 0 | 0 | 0 | 0 | 0 | 0 | 0 | 0 | 0 | 0 | 0 |

FIG. 17B

Grating acts as dispersing beam-splitter for Michelson Interferometer. Observe with same viewing optics, but image the back focal-plane of the viewing optics objective.

OPTICAL ALIGNMENT APPARATUS HAVING MULTIPLE PARALLEL ALIGNMENT MARKS

This application is a continuation-in-part of application Ser. No. 08/455,325 filed May 31, 1995, by Patrick N. Everett, Euclid Eberle Moon and Henry I. Smith for INTERFEROMETRIC BROADBAND IMAGING, and now abandoned.

This invention was made with government support under research grant numbers 9407078-ECS awarded by the National Science Foundation and under contract number DAAH04-95-1-0038 awarded by the Army Research Office. The government has certain rights in the invention.

This invention relates to a means for aligning, by optical means, one substantially planar object, such as a mask, with respect to a second planar object, such as a substrate. The invention achieves a high degree of sensitivity, accuracy capture range, and reliability through a novel design of alignment marks located on both the mask and the substrate. Further advantages are gained by adding controlled spatial filtering. Two means of measuring the gap (i.e. "gapping") between mask and substrate are also provided. The first uses the alignment marks on both mask and substrate and controlled spatial filtering; The second uses marks on only one of the objects.

For background reference is made to U.S. Pat. Nos. 4,200,395, 4,340,305 and 5,414,514. The present invention represents an improvement of the invention in U.S. Pat. No. 5,414,514 incorporated herein by reference.

It is an important object of the invention to provide improved optical alignment and measuring.

According to the invention, alignment marks on a first plate, such as a mask, and a second plate, such as a substrate, comprise one or more simple periodic gratings. A grating on the first plate, having a period or pitch $P_1$, is paired up with the grating on the second plate that has a slightly different period, $P_2$. A light source is constructed and arranged to illuminate the gratings to produce overlapping diffracted beams that create discernible interference patterns (sometimes called moire patterns) characterized by a phase brought into a predetermined relationship with the phase of a reference pattern by relatively displacing the two plates. Additional grating pairs with differing periods on the respective plates increase the range of freedom from measurement ambiguity.

According to another aspect of the invention, observing optics responsive to the diffracted beams includes controlled spatial filtering. Controlling the spatial filtering and simultaneously observing details of the resulting pattern permits measuring of the gap between the plates. The spatial filtering also reduces unwanted light illuminating the imaging sensor, such as light from uncontrolled scattering and reflection from the surfaces of the plates.

According to another feature of the invention, the gratings and any reference pattern on either plate are interrupted by spaces in their lines to form a secondary grating with period '$P_s$'. This interruption results in secondary diffraction in a plane perpendicular to the primary diffraction and allows the light used for illumination and observation to arrive and leave at angles other than normal to the plates, thereby allowing the area immediately above the critical exposure area of the plates to be free of optics associated with the aligning and gapping operation. An advantage is there is no need to remove aligning optics during lithographic exposure through a plate, and aligning and gapping may be verified and optimized during exposure. Another advantage is that the signal-to-noise ratio is improved because the specular reflections from the plates are no longer reflected back into the observing optics.

According to another feature of the invention, the second plate includes a checkerboard pattern instead of or in addition to the interrupted-grating patterns. It is advantageous to use one or more checkerboard patterns on the second plate in combination with the grating patterns on the first plate. Each checkerboard pattern may be formed by squares, rectangles or other shapes in a rectilinear or nonrectilinear pattern. The spatial period may be the same or different in different directions.

This checkerboard pattern, like the interrupted-grating pattern, causes secondary diffraction in a plane perpendicular, or at some other angle, to the primary diffraction and allows the light used for illumination and observation to arrive and leave at angles offset from perpendicular to the plates, thereby allowing the area immediately above the critical exposure area of the plates to be free of optics associated with aligning and gapping with the same advantages of the system described above. The spatial period of the checkerboard pattern in the secondary plane, in combination with the wavelength of the illumination, determines the offset angle from the normal to the plates.

An advantage of the checkerboard pattern feature is that the diffracted light arrives at the viewing optics from fewer directions. This advantage improves the contrast of the observed moiré-interference patterns, and the contrast changes less with changes in the gap between the plates.

With the checkerboard pattern, when optimally adjusted, no light arrives at the viewing optics in the pure zero-order direction leading to the advantages just described. In particular, the checkerboard pattern feature eliminates the fundamental interferences that occurred between the zero-order path and each of the other paths, leaving only harmonic interference between the remaining paths. The resulting moiré-interference pattern thus has generally higher contrast, the contrast fluctuates less with changing gap between the two plates, and the sensitivity improves because the phase of the harmonic changes twice as fast as that of the fundamental when the plates move laterally relative to each other.

Spatial filtering still improves the signal-to-noise ratio when using the checkerboard pattern. The same spatial filters can serve simultaneously both for checkerboard and for interrupted-grating marks beside each other on the second plate. When using only the checkerboard grating on the second plate, the on-axis (i.e. central) spatial filter may advantageously be blocked to further enhance the signal-to-noise ratio.

The previously described method for measuring gap, using marks on both plates, requires some pure zero-order light. An advantageous arrangement is to include both a checkerboard pattern and an interrupted-grating pattern on the second plate, working with suitable grating, as described, on the first plate, to achieve optimal aligning and optimal gapping simultaneously.

According to another feature of the invention, the gap between the plates may be measured without using any marks on the second plate (i.e. the substrate in x-ray lithography, for example). This feature is particularly advantageous during the initial lithographic step in x-ray lithography because generally there are no marks on the substrate. By using a grating on the first plate with period and illumination angles such that a portion of the illuminating light striking this grating is diffracted perpendicular to the surface toward the second plate (or substrate), and another portion diffracted in the opposite direction toward the other surface[s] of the first plate. Both portions then reflect back upon themselves to meet again at this grating. Some portion of each of these reflected portions, on striking the grating a second time, is diffracted approximately back toward the source and the observing optics. These two returning beams interfere, and the image of the resulting fringes provides a representation of the difference between the two optical paths that were traversed. In a case where the first plate (or mask), has a uniform and well-characterized thickness (such as in x-ray lithography), this characteristic furnishes an accurate measure of the gap between the two plates. The measuring system may be regarded as a quasi-Michelson interferometer, with the grating on the mask corresponding to the beam-splitter in a conventional Michelson interferometer. An important additional feature is that the grating is a spectrally dispersive beam-splitter so that different wavelengths are separated in angle on the return path toward the observing optics.

The grating on the first plate or mask for this gapping measurement has its grating lines oriented perpendicular to those on the same plate used for the aligning. However, the observing optics may be identical or very similar, and the same optics and camera can be constructed and arranged to serve both measuring functions. For some applications, the optics may be identical; in others, a small adjustment of the focusing may be desirable when changing between the alignment and gap-measuring functions. Alternatively, there may be more than one optical path, separated by a beam-splitter for the two types of measurement.

When the illumination contains more than one narrow spectral band, then each diffraction will cause the light to diffract in a slightly different direction depending upon its wavelength. Consequently, not all the light then travels exactly perpendicular to the plates after the first diffraction, and the exiting light will be dispersed twice as much. The angle generally has little or no effect on the length of the path that is traversed. In cases where this effect is significant, the error can be compensated.

The dependence of emerging angle upon wavelength is a useful property of the invention. This property permits independent observation of the interference at different wavelengths, and relaxes any requirement for spectral coherence in the incoming light. In fact, it is advantageous to have a few spectral lines in the illumination, or even better to have white light because white light illumination allows simultaneous measurements at as many different wavelengths as can be discerned. If the observing optics are regarded as a spectrometer, then a camera may record the interference-intensity as a function of angle. Angle then translates to wavelength via the dispersive relationship of the grating in double-pass.

If a single spectral line is used in the illumination, it is advantageous to scan the gap to obtain a reliable measurement, and there will be ambiguity in measurement of the gap. The ambiguity may be removed by providing at least two spectral lines, and preferably more than two, for illumination. It is even more advantageous to provide a continuous spectrum for illumination over a suitable band. Then the dispersed pattern, imaged on a photosensitive area of a camera, facilitates measuring the gap without scanning.

Numerous other features, objects and advantages of the invention will become apparent from the following detailed description when read in connection with the accompanying drawings in which:

FIGS. 1–3 and 5 correspond to FIGS. 1–3 and 5 in U.S. Pat. No. 5,414,514;

Figure 4:
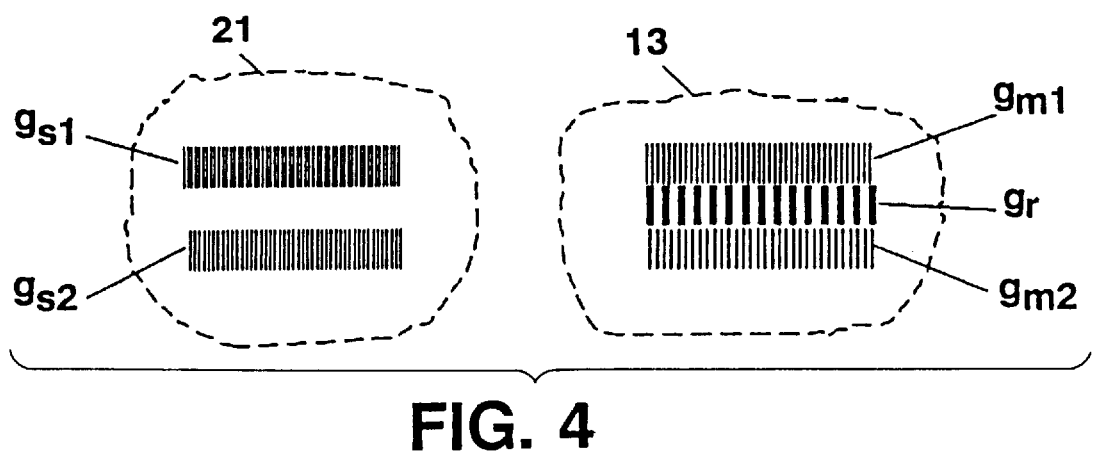
FIG. 4 illustrates one form of complementary alignment marks according to the invention.
Figure 5:
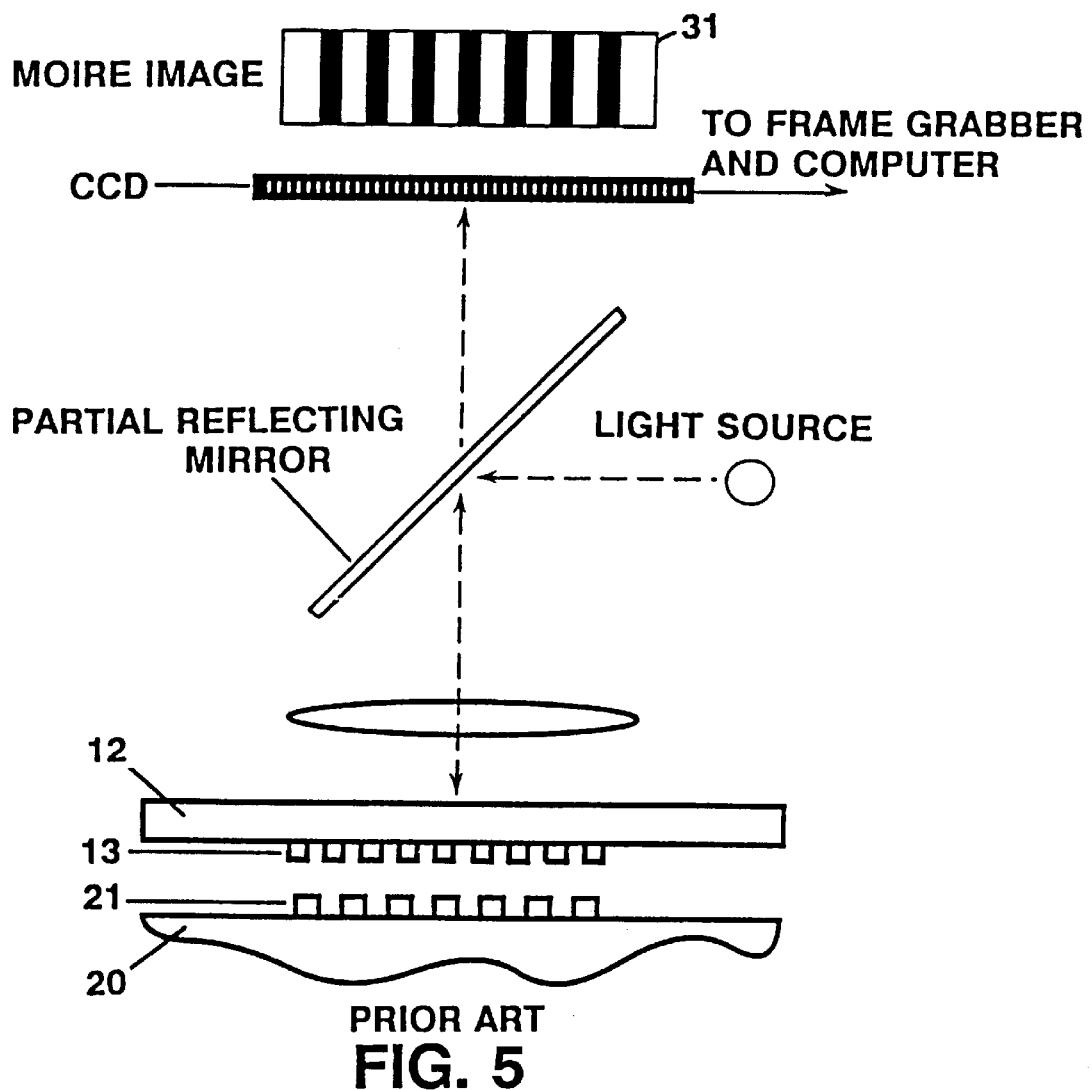
Figure 6:
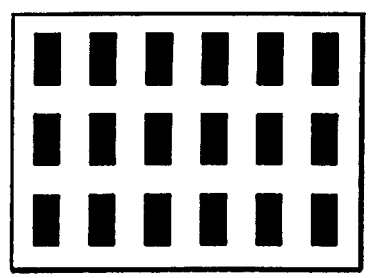
Figure 7:
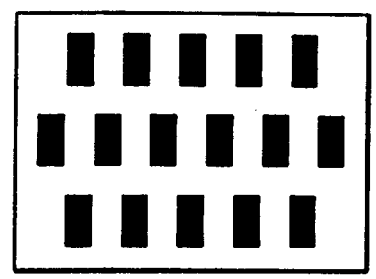
Figure 8:
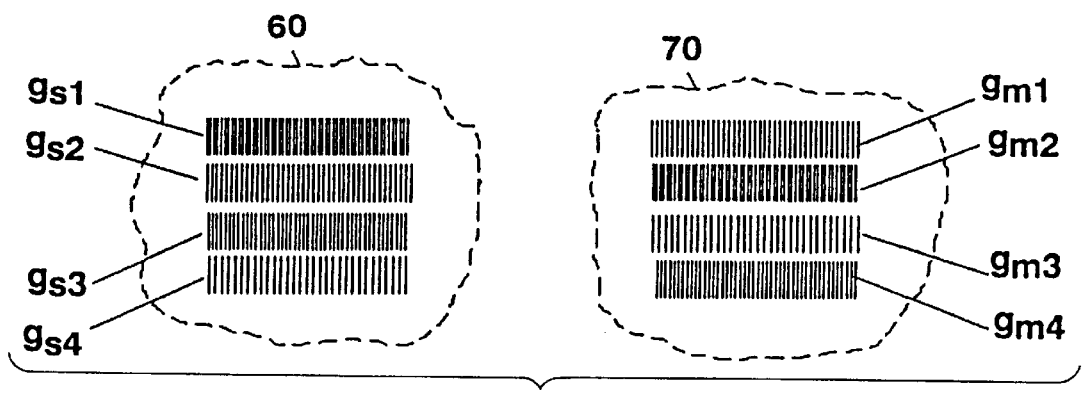
Figure 9:
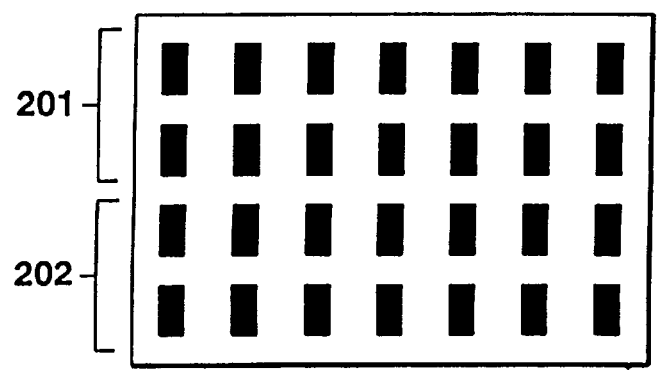
Figure 10:
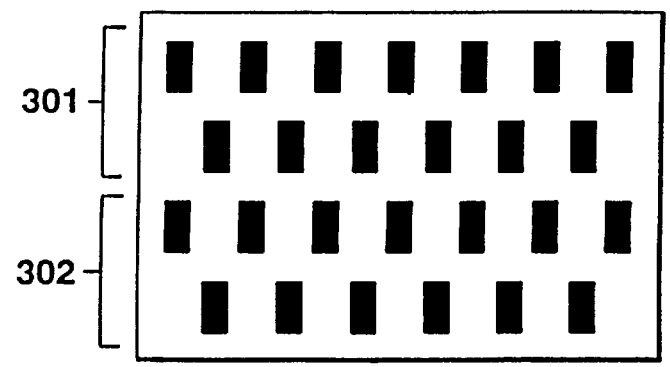
Figure 11:
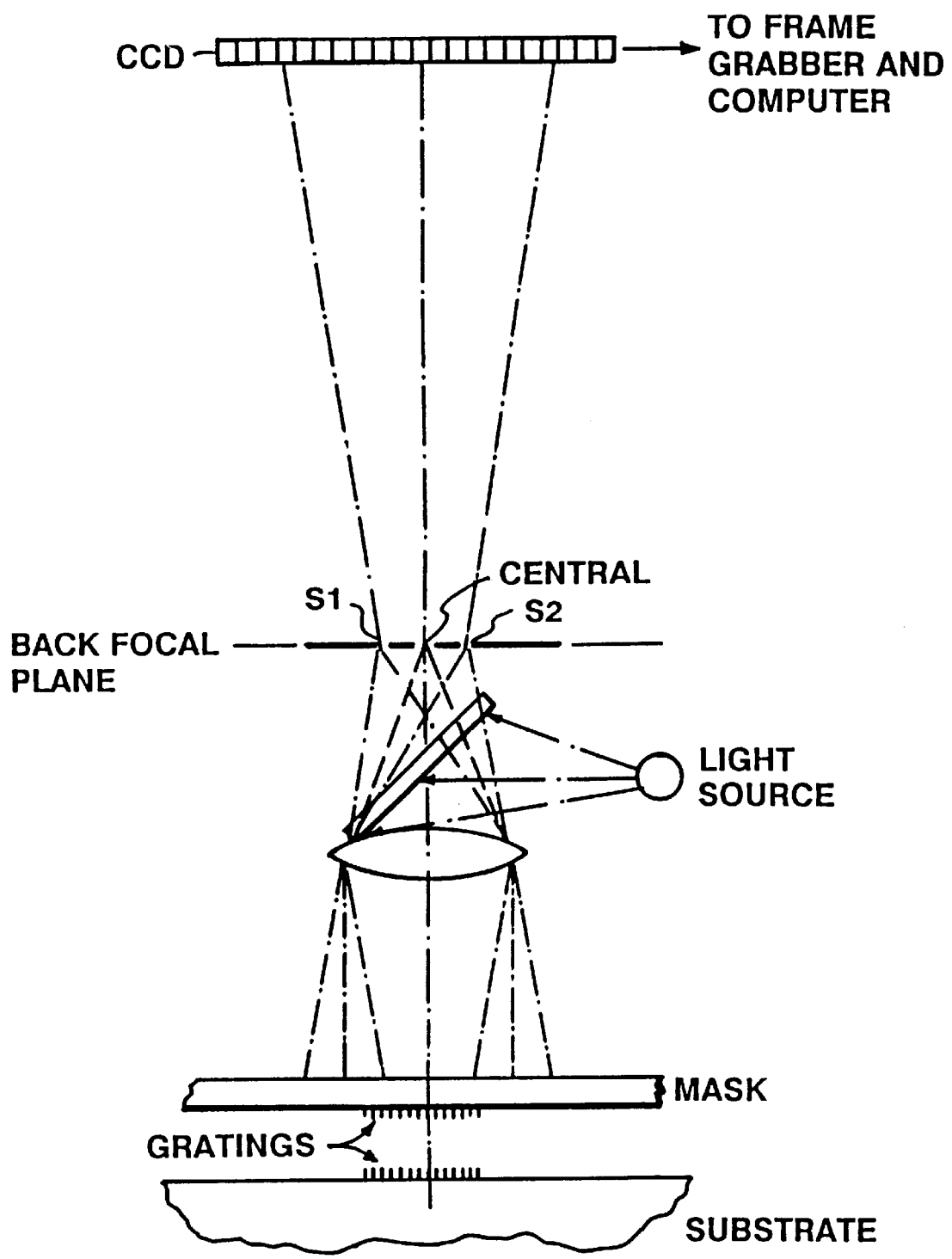
Figure 12:
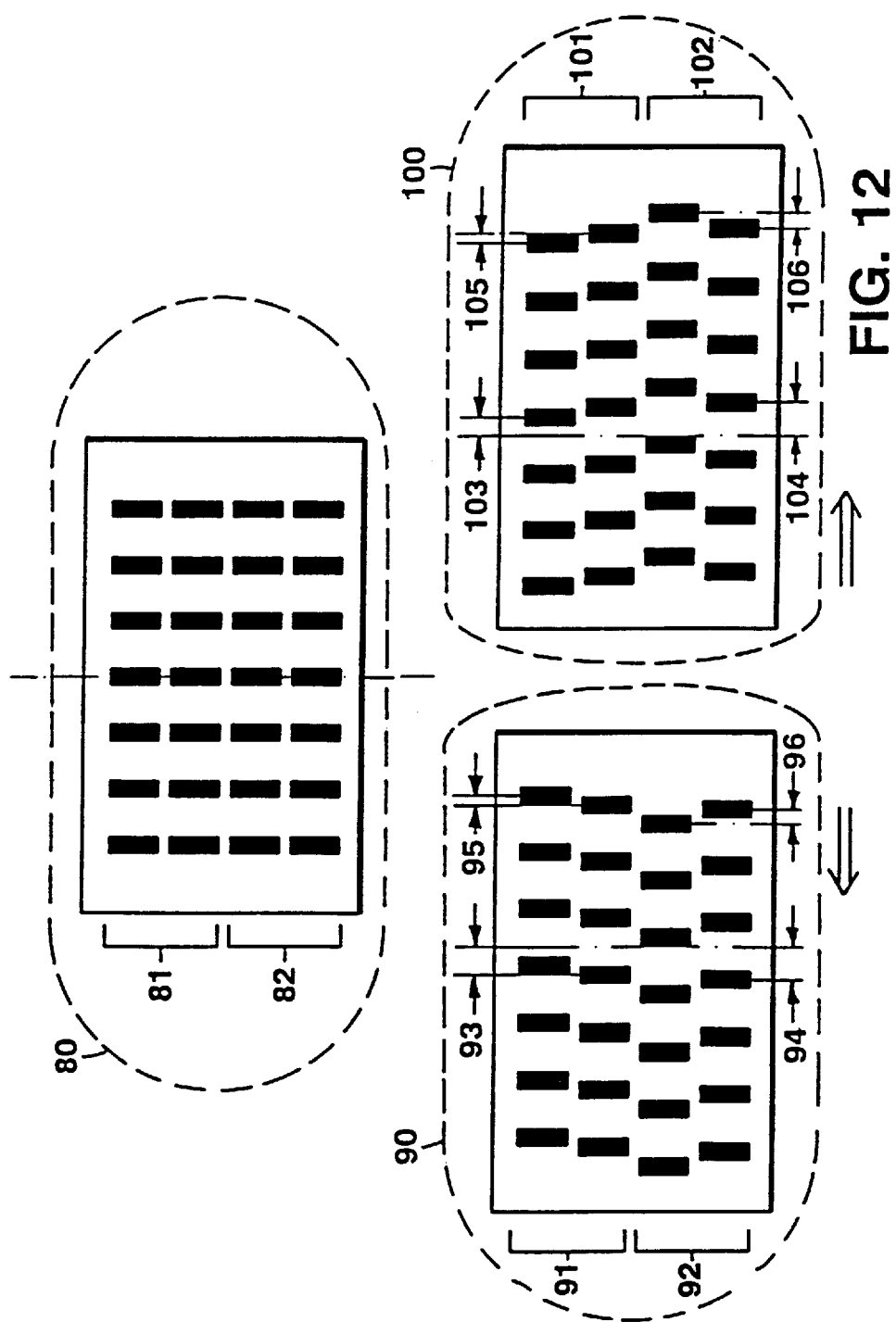
Figure 13:
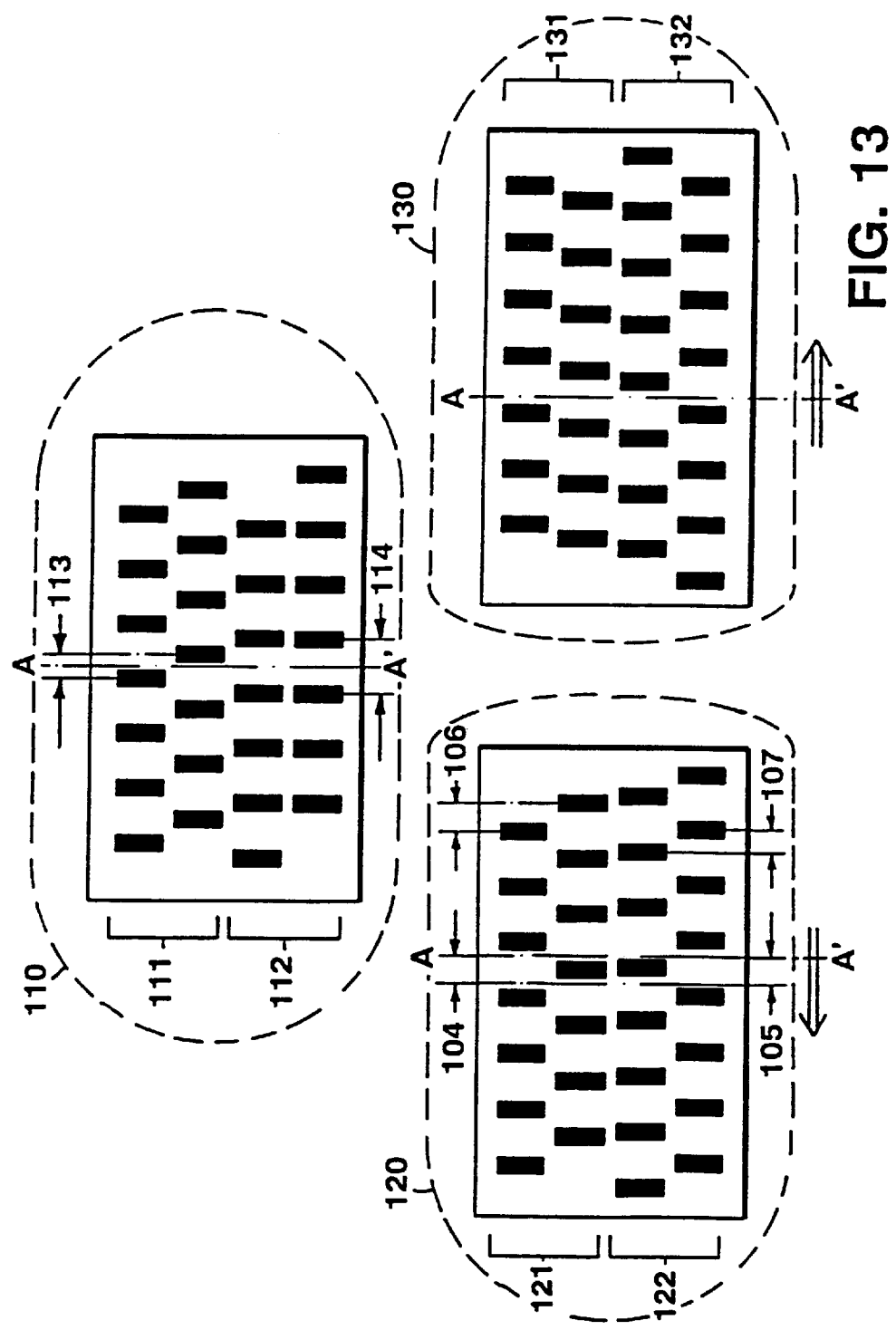
Figure 14:
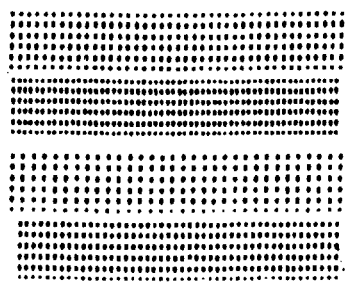
Figure 15:
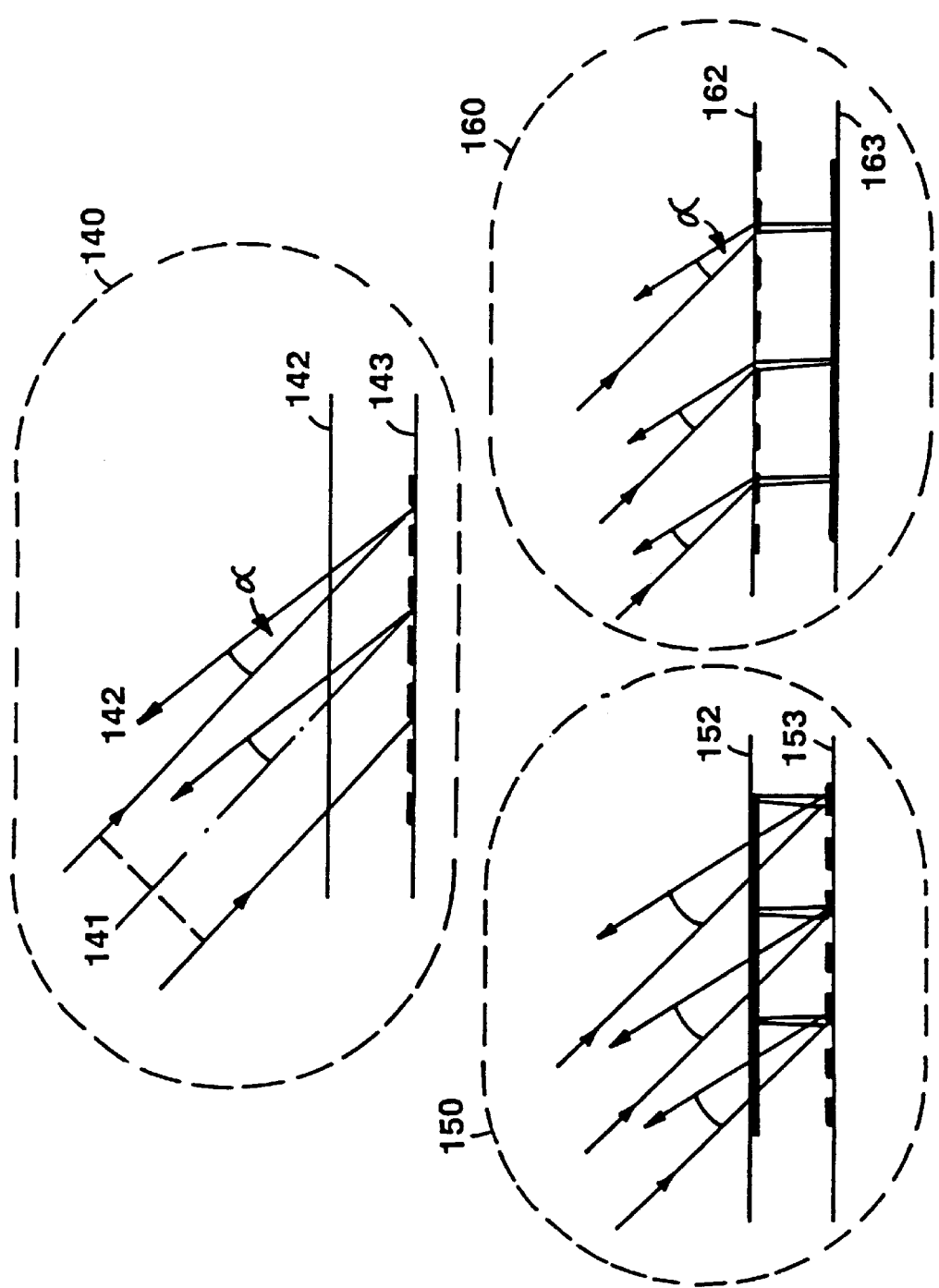

FIG. 5 schematically illustrates viewing alignment marks with a microscope;

FIG. 6 illustrates the image when the alignment marks of FIG. 4, according to the invention, are superimposed;

FIG. 7 illustrates the image of FIG. 6 when mask and substrate are misaligned;

FIG. 8 illustrates an especially advantageous arrangement of alignment marks, according to the invention;

FIG. 9 illustrates the image when the alignment marks of FIG. 8, are correctly superimposed, i.e. aligned;

FIG. 10 illustrates how the image of FIG. 9 changes when mask and substrate are misaligned, according to the invention;

FIG. 11 illustrates spatial filtering to enable gap measurement, according to the invention;

FIG. 12 illustrates the image corresponding to FIG. 9 for the cases of three different blockings of spatial-filters, when mask and substrate are aligned, according to the invention;

FIG. 13 is as FIG. 12, except that it shows the interference fringes with mask and substrate misaligned according to the invention;

FIG. 14 illustrates how one of the marks is periodically interrupted to cause secondary diffraction, to enable off-normal illumination and observation, according to the invention;

FIG. 15 illustrates three geometries that achieve the off-normal illumination and observation of interference fringe patterns, according to the invention;

FIG. 16 shows checkerboard and interrupted grating patterns, respectively;

FIGS. 17A and 17B show two-dimensional Fourier Transforms of the checkerboard and interrupted-grating patterns, respectively, of FIG. 16.

Figure 18A:
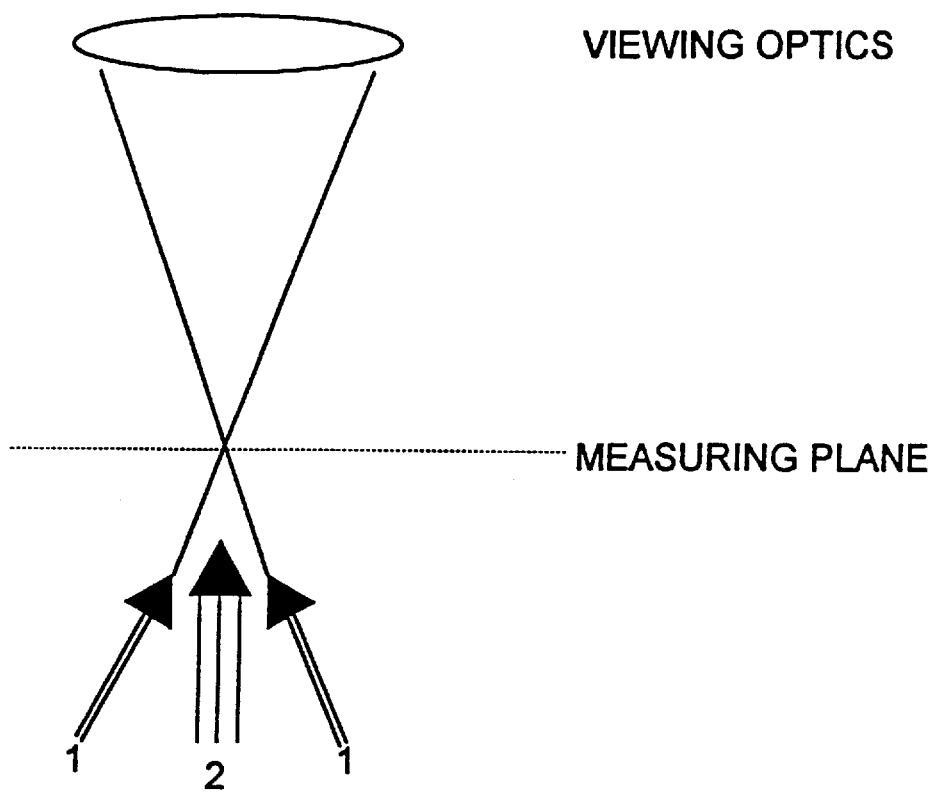
Figure 18B:
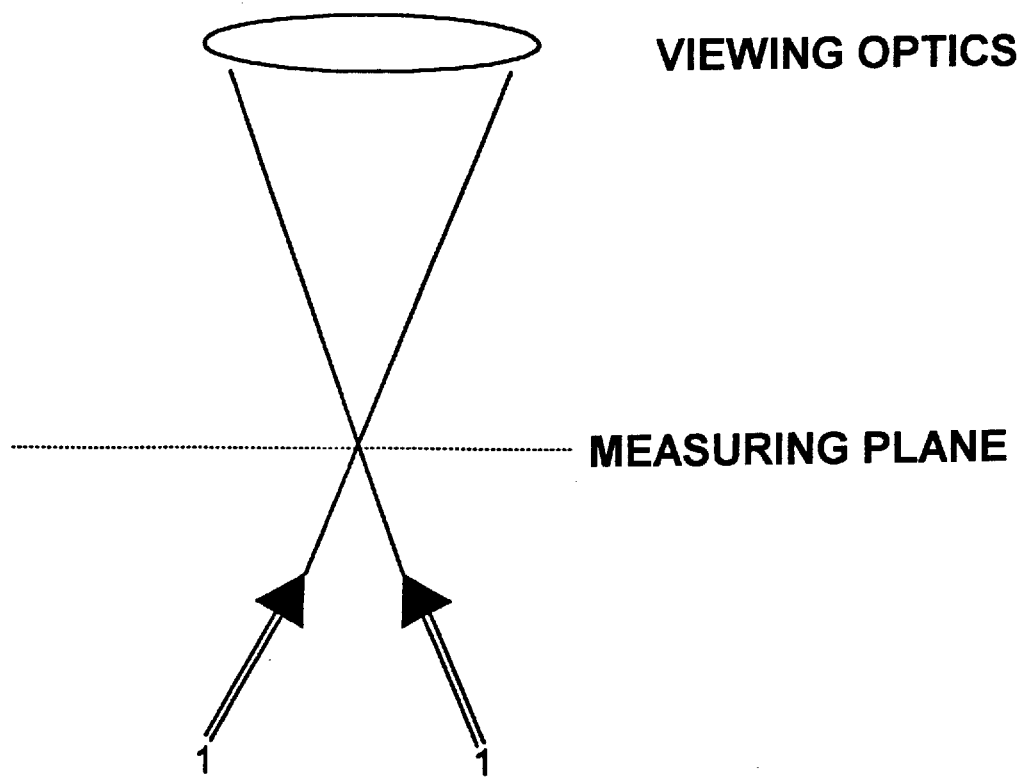
Figure 19:
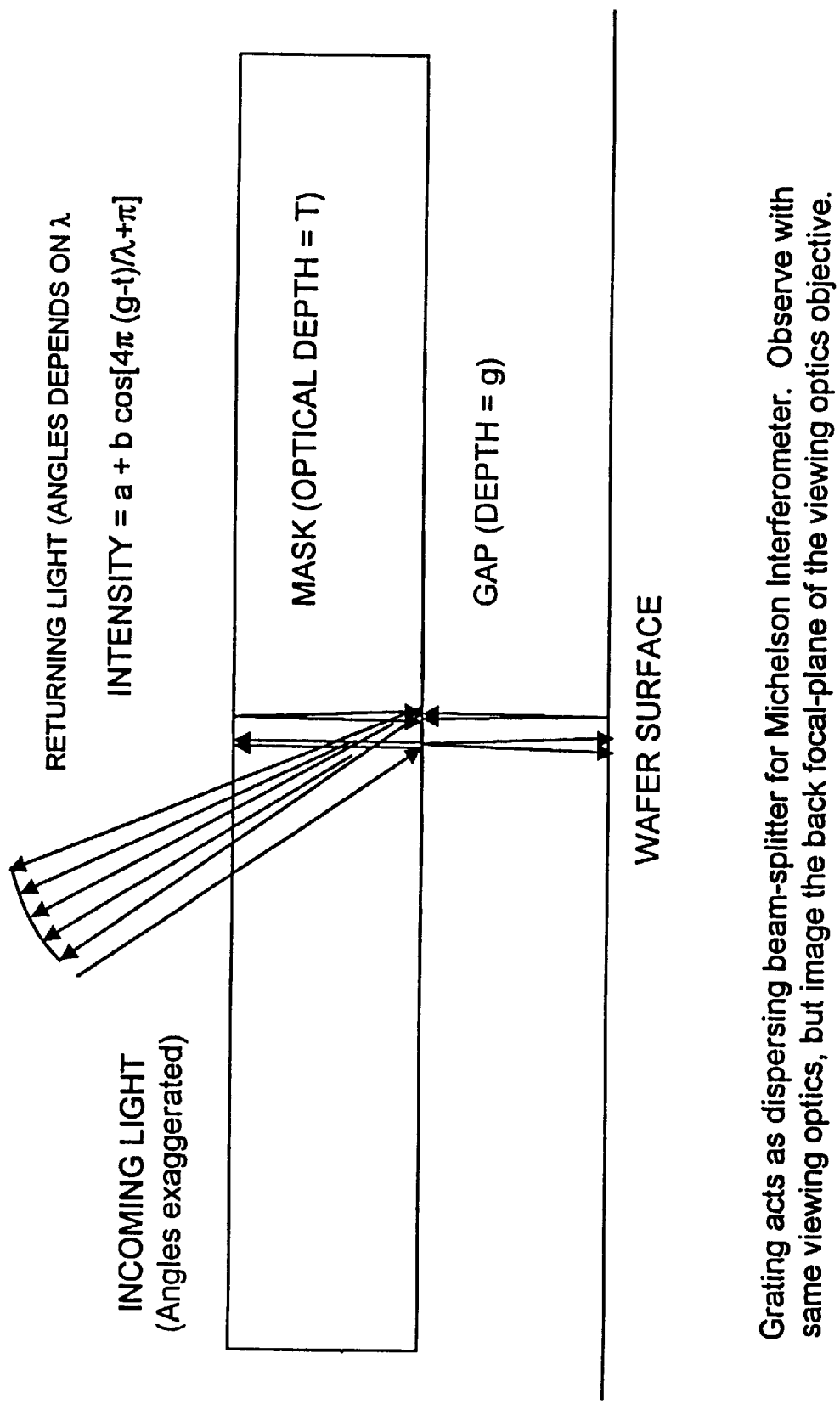
Figure 20:
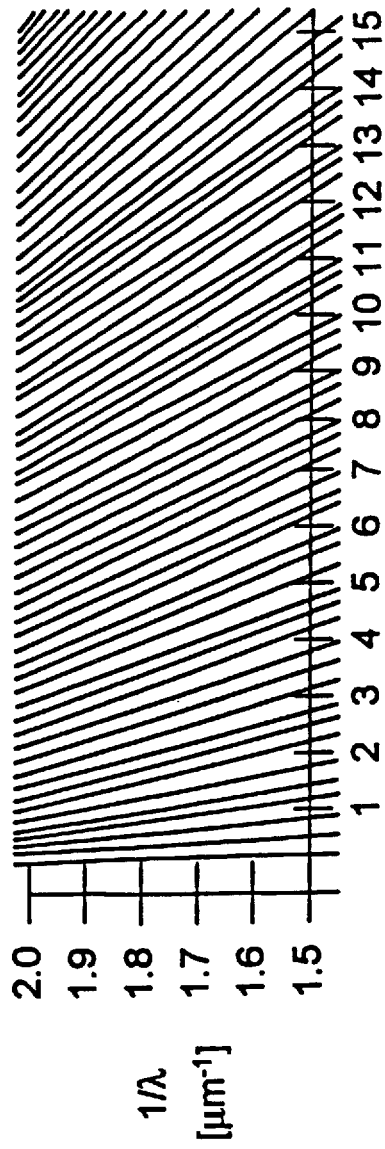
Figure 21A:
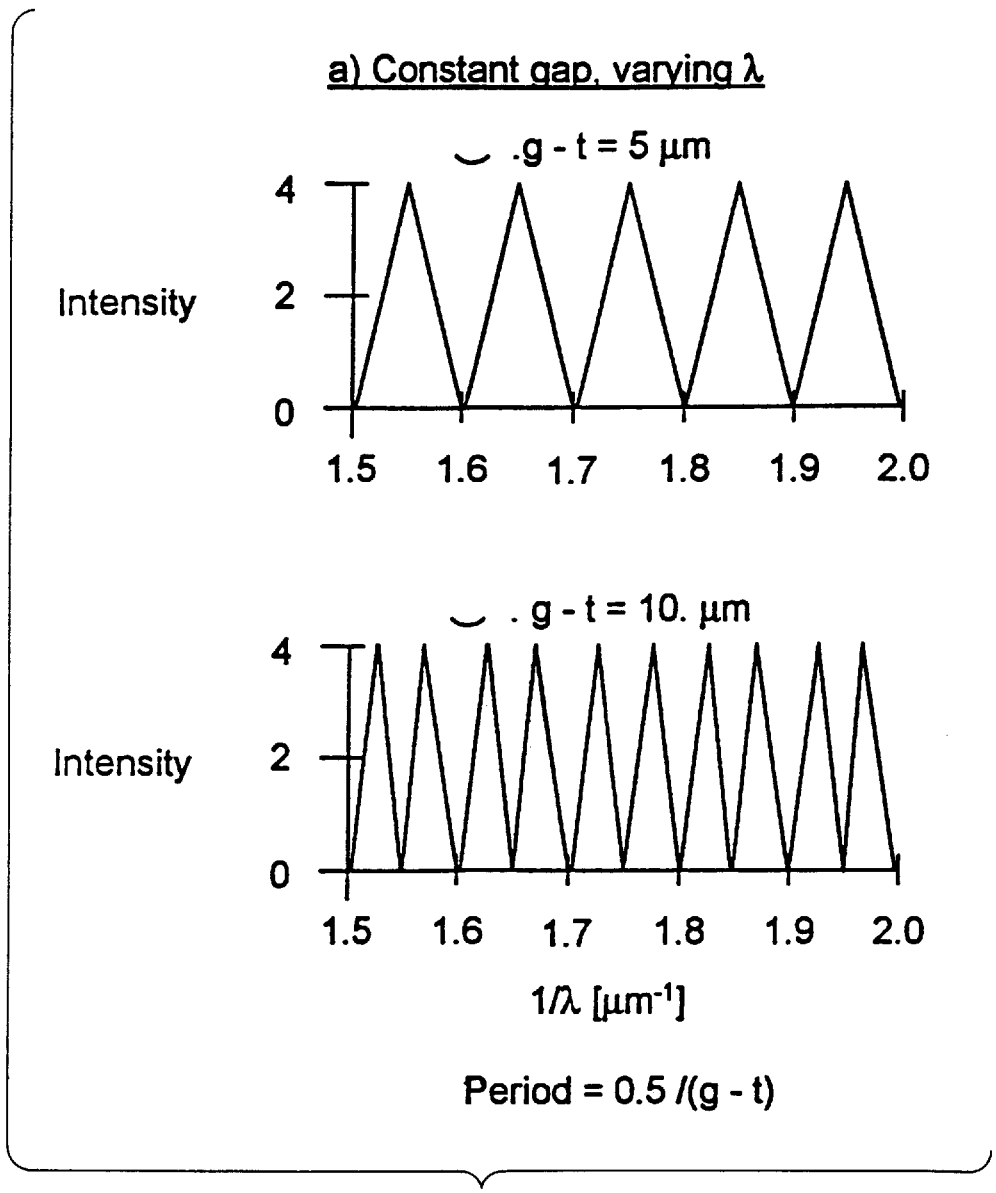
Figure 21B:
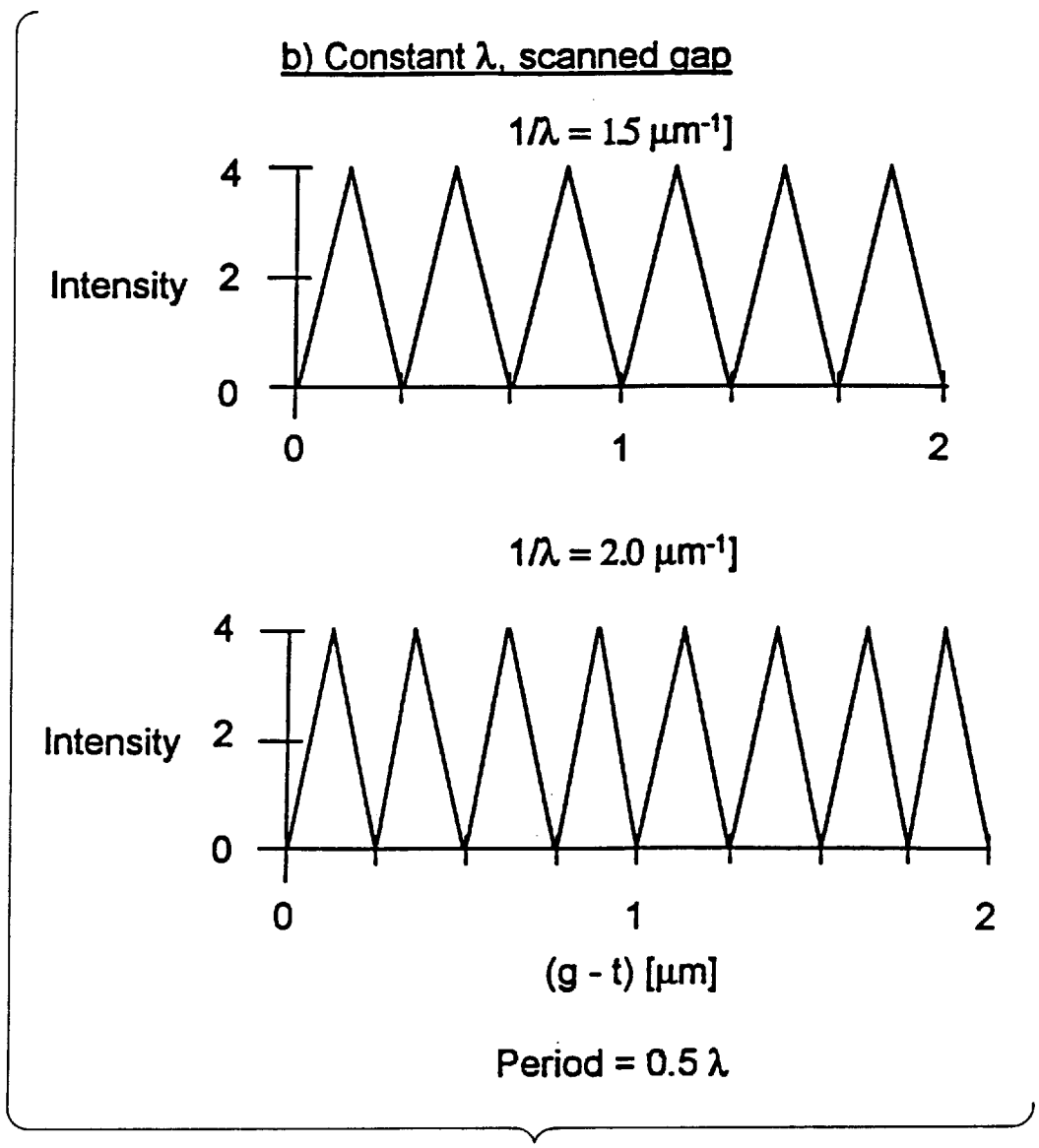

FIGS. 18A and 18B are diagrammatic representations of the light diffracted paths entering the viewing optics with an interrupted grating and checkerboard pattern, respectively, on the substrate;

FIG. 19 is a diagram illustrating the dispersive quasi-Michelson interferometer formed by a grating on a mask with reflections from a substrate surface and from an opposite surface of the mask;

FIG. 20 is a graphical representation of intensity of the fan of emerging light as a function of gap and angle; and FIGS. 21A and 21B show perpendicular cuts through the graphical representation of FIG. 20 at constant gap and constant wavelengths, respectively.

Figure 1:
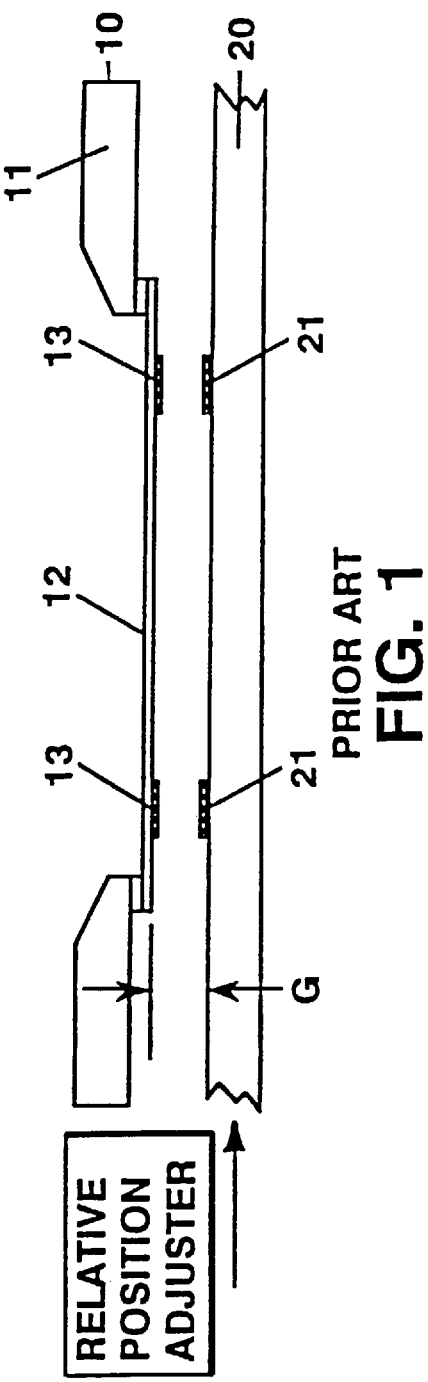
FIG. 1 is a cross-sectional view of a mask and substrate.

With reference to the drawings, FIG. 1 illustrates a cross sectional view of x-ray mask 10 separated from substrate 20 by a small gap, G. The mask 10 includes a support frame 11, membrane 12, and alignment marks 13. Complementary alignment marks 21 are located on the substrate and face the mask alignment marks 13.

Figure 2:
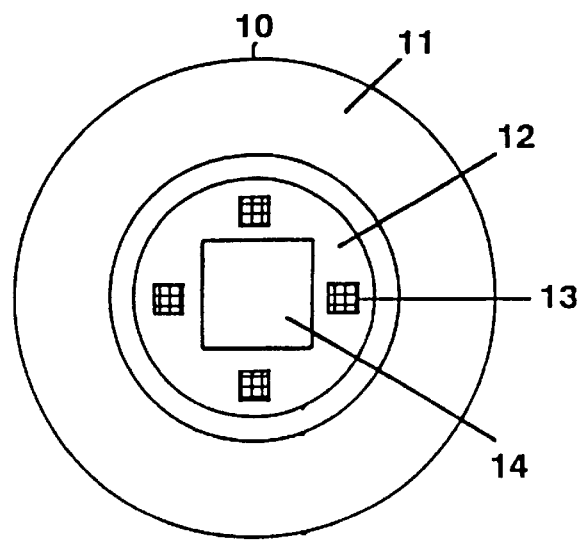
FIG. 2 is a plan view of the mask showing alignment marks.

FIG. 2 is a plan view of mask 10, showing four alignment marks 13. The central region of mask 10 includes pattern region 14 which contains the pattern that is to be superimposed over a pattern on the substrate.

Figure 3:
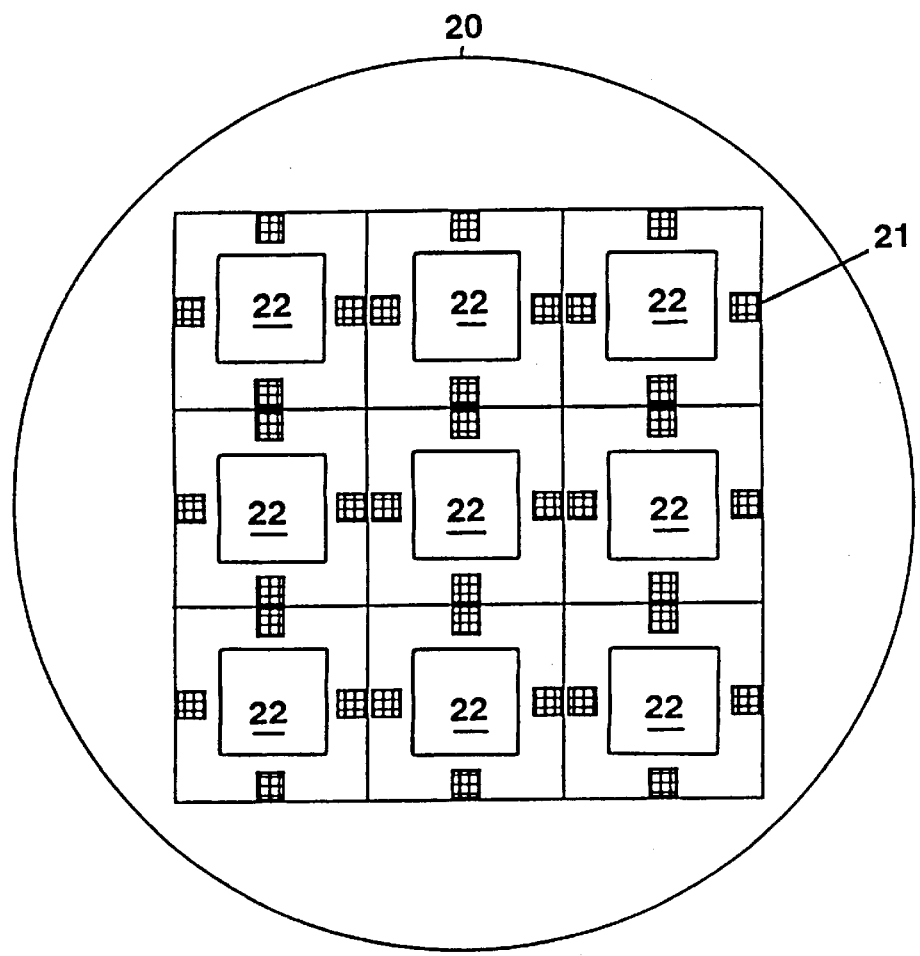
FIG. 3 is a plan view of the substrate showing multiple identical regions to be exposed.

FIG. 3 is a plan view of the substrate containing multiple identical regions of patterns 22 over which mask pattern 14 is to be superimposed in a sequence of three steps: (1) move to one of the multiple sites; (2) align mask alignment marks with respect to substrate alignments marks; (3) expose mask pattern 14 on top of substrate pattern 22.

As disclosed in U.S. Pat. No. 5,414,514: visible or near-infrared light is preferably used as the illuminating source, spanning a wavelength band from 400 to 900 nm, but other wavelengths may also be used; the light must be collimated with good spatial coherence; it is necessary that grating periods exceed wavelengths used in the illuminating bandwidth, so that first order diffraction is possible. The first order diffraction angle is $$\sin \Theta = \lambda/g,$$

where $\Theta$ is the diffraction angle, $\lambda$ is the wavelength, and g is the period. Hence first-order diffraction with $\lambda/g > 1$ is not possible; it is desirable that grating periods exceed twice the value of any wavelengths used in the illuminating bandwidth, to ensure that first order diffraction occurs at an angle of no more than 30 degrees. This permits each diffracted beam to intercept a large fraction of the paired grating, provided that the width of the mark, W, is larger than the mask-substrate gap G. Preferably, W should be larger than 2G, noting that the gap G ranges from a few to 40-micrometers in current versions of x-ray lithography. Preferably, the alignment marks should include 10 or more periods of each of the paired gratings.

Referring to FIG. 4, there is shown an arrangement of pairs of complementary alignment marks with differing periods according to the invention to increase the range of freedom from measuring ambiguity. This feature increases the range of misalignment that can be measured without ambiguity, or increases the "capture range."

To facilitate understanding the mode of operation with the larger number of gratings compared with the number disclosed in the '514 patent, it is convenient to use a slightly different notation for identifying the gratings and their periods. Any fixed "reference" grating is identified by a $._r$, to denote it as a "reference" grating and a $._n$, (a number) to associate it with the grating pair, on substrate and mask, with which it is associated. Each nonreference grating is identified by a $._s$, or $._m$, to denote whether it is on the substrate or mask, respectively, and a $._n$, (a number) to connect it with its paired grating and with an associated "reference" grating (if there is one). Thus, a grating on the substrate having a period $g_{sn}$ will always be paired with a grating on the mask having period $g_{mn}$, and any "reference" grating associated with it will have period $g_{rn}$ where 'n' is a number denoting pairing and association. When the substrate and mask are "aligned," then substrate grating $g_{sn}$ will be facing its paired grating $g_{mn}$. If there is an associated reference grating $g_{rn}$, then it will be adjacent either on the mask or on the substrate. In every case $g_{sn}$ will differ from $g_{mn}$, and $g_{rn}$ will always exceed both $g_{sn}$ and $g_{mn}$. There will always be either a reference grating associated with a grating pair, or another grating pair to generate a countermoving fringe pattern as disclosed in the '514 patent. The additional grating pairs with differing periods according to the invention increase the range of freedom from measurement ambiguity.

In one arrangement the substrate alignment mark 21 includes two simple linear gratings having different spatial periods $g_{s1}$ and $g_{s2}$. The mask alignment mark 13 includes two simple linear gratings having different spatial periods $g_{m1}$ and $g_{m2}$. In between the gratings $g_{s1}$ and $g_{s2}$, or between the gratings $g_{m1}$ and $g_{m2}$ (latter is shown in FIG.4) is an unpaired reference grating having a period $g_r$ which is coarser than any of $g_{s1}$, $g_{s2}$, $g_{m1}$, and $g_{m2}$. The periods $g_r$, $g_{s1}$, $g_{s2}$, $g_{m1}$, and $g_{m2}$ are chosen so that $$g_r = g_{s1} g_{m1}/|g_{s1} - g_{m1}| = g_{s2} g_{m2}/|g_{s2} - g_{m2}|$$

This relationship ensures that $g_r$ is also the period of the two interference fringe patterns formed by the overlap of beams diffracted by the gratings. One such pattern results from interference of beams diffracted by gratings $g_{s1}$ and $g_{m1}$. The second such pattern results from interference of beams diffracted by gratings $g_{s2}$, and $g_{m2}$.

For example, if $g_{s1}$ is given a value of 4 micrometers and $g_{m1}$ the value 3.7 micrometers, then a value of $g_r$=49.33 micrometers satisfies eq.(1). If $g_{s2}$ is given a value 33.64 micrometers and $g_{m2}$ the value 20 micrometers, then eq.(1) is still satisfied with the same value of $g_r$=49.33 micrometers. Thus eq.(1) can be satisfied with $g_{s1}$, $g_{m1}$, $g_{s2}$ and $g_{m2}$ all having different values. In general, to avoid ambiguity, the periods $g_{s1}$, $g_{m1}$, $g_{s2}$ and $g_{m2}$ should have values that are not simple multiples of one another. There are some exceptions; for instance the larger of $g_{s1}$, and $g_{m1}$, might be equal to the smaller of $g_{s2}$ and $g_{m2}$. Such rules will be apparent to those skilled in the art.

More such sets of grating-pairs and corresponding unpaired reference gratings can be added, and are within the principles of the invention. Such additional sets further increase the range of freedom from ambiguity and thus extend the "capture range." They also afford the opportunity for additional simultaneous measurements to reduce statistical noise in the alignment.

FIG. 5 is a schematic diagram illustrating the viewing of the pairs of facing alignment marks 21 and 13 by a microscope. The imaging and image-processing is disclosed in the '514 patent. The present invention includes an added fringe pattern resulting from the overlay of the gratings illustrated in FIG. 4, to increase the range of freedom from ambiguity as discussed above. The "frame grabbing," storing, and signal processing corresponds to that disclosed in the '514 patent, except the present invention involves more adjacent fringe and/or reference patterns to have phases compared. Alignment occurs upon attainment of a predetermined phase difference. For example, this phase difference could be zero, in which case the microscope image would appear as in FIG. 6 when alignment occurs. When the relative mask and substrate positions are slowly changed, the fringe patterns will translate at higher, and different rates. This translation not only results in magnification of the relative motion, but also overcomes the ambiguity problem that would arise with only one grating pair when the relative motion is a multiple of a grating period.

FIG. 6 illustrates the interference fringe patterns, and the reference pattern, observed when the alignment marks of FIG. 4 are properly superimposed.

FIG. 7 illustrates an example of how the fringe patterns of FIG. 6 are shifted relative to each other when mask and substrate are relatively displaced perpendicular to the lines of the grating pairs.

FIG. 8 illustrates an especially advantageous arrangement of alignment mark pairs on mask and substrate according to the invention. In this arrangement additional pairs of gratings replace the fixed reference grating $g_r$ of FIG. 4. This is similar to the counter-moving fringes depicted in FIGS. 7 to 12 of U.S. Pat. No. 5,414,514. Under relative mask-substrate motion, the marks depicted in FIG. 8 produce fringe motion. Preferably the periods are assigned such that $$g_{s1} = g_{m2}, g_{s2} = g_{m1},$$

and $$g_{s4} = g_{m3}, g_{s4} = g_{m3}$$

This ensures $$g_{s1}g_{m1}/(|g_{s1} \ g_{m1}|)=g_{s2}g_{m2}/(|g_{s2}g_{m2}|)=P_{12}$$

and $$g_{s3}g_{m3}/(|g_{s3} \ g_{m3}|)=g_{s4} \ g_{m4}/(|g_{s4}g_{m4}|)=P_{34}$$

When these relations are satisfied, with diversity otherwise maintained in the grating periods, the extent of freedom from measurement ambiguities is increased, and "capture range" is thus increased. Additional sets of gratings can be added to further expand the capture range, as will be evident to those skilled in the art. It is further advantageous to have $P_{12}$ equal, or approximately equal, to $P_{34}$. This greatly simplifies the alignment and gap-measuring algorithms, while expanding the range of freedom from measurement ambiguities and increasing capture range.

FIG. 9 illustrates the fringe interference patterns observed when the alignment marks of FIG. 8 are correctly superimposed, i.e. aligned, according to the invention. The fringe patterns 201 form a partnership of counter-moving fringes. The fringe patterns 202 form a second partnership of counter-moving fringes. They will exhibit different rates of separation when the substrate and mask become misaligned, thereby eliminating ambiguities of $2\pi$ in phase.

FIG. 10 illustrates how the fringe interference patterns of FIG. 9 shift relative to each other when mask and substrate are relatively displaced perpendicular to the lines of the grating pairs according to the invention. The fringes 201 have counter moved to form fringe pattern 301. The offset indicates the misalignment. In addition, independent fringe partnership 202 has countermoved by a different phase offset to form the fringe pattern 302, yielding an independent measurement of the misalignment. The two measurements eliminate ambiguities, at least out to some further capture range than was possible with only one partnership of fringes, in a way that will be evident to those skilled in the art. Addition of further fringe partnerships allows further extension of capture range.

FIG. 11 illustrates spatial filtering in the viewing optics, according to the invention. A spatial filter is included in the back focal plane of the observing optics, or in an equivalent image plane thereof, to accept only the light emerging in what is termed the "zero-order-group" of emerging paths. The "zero-order-group" terminology is explained in the following way. When the illuminating light first encounters the gratings in the mask aligning-mark, there is opportunity for diffraction. When it then encounters the substrate, it is reflected, again with opportunity for diffraction. There is a third opportunity for diffraction when emerges through the mask. Light that has experienced no diffraction emerges in the same direction as that of specular reflection from a flat surface. Light that has experienced a "+1" diffraction on first encountering the mask, and then a "−1" diffraction on emerging through the mask, will also emerge at the angle of specularly-reflected light. Similarly for "−1" followed by "+1", both at the mask. All such light emerges at the specular angle designated "pure-zero-order." Light that has experienced opposing diffractions at mask and substrate will emerge at a small angle from the specular reflection, since the periods of those grating pairs are slightly different. Such light is designated as "quasi-zero-order." It emerges at a much smaller angle, from the specular direction, than would any light that emerges after a single diffraction from any of the gratings. The "zero-order-group" includes both the "pure-zero-order" and this "quasi-zero-order" light. The "pure zero-order" light will pass through a central spatial filter in the back focal plane of the observing optics. The "quasi-zero-order" light will pass through two spatial filters, suitably situated, on either side of the central spatial-filter. Thus, all of the light used in the measurements will pass through these three spatial filters, as will be evident to those skilled in the art. Any light other than that emerging in the "zero-order group" can be considered as noise. Hence the advantage of the spatial filtering in improving signal/noise ratio is immediately seen. Additionally, blocking one of the outer spatial-filter holes destroys the symmetry that normally results in the fringe pattern being independent of mask-substrate gap and of wavelength. Consequently, when one of the outer spatial-filter holes is blocked, the imaged fringe pattern for each fringe partnership moves en-masse through a phase determined by the gap, the detailed grating periods, and the wavelength of the light. Additionally, the adjacent interference-fringe patterns within the partnership will be displaced relative to each other by a small amount. Blocking the outer spatial-filter holes in turn will cause equal such shifts but in opposite directions. These offsets are measured to indicate the gap between mask and substrate. The en-masse shifts and the relative shifts will each give a measurement of the misalignment, to a different scale. Since the component gratings of the different fringe partnerships have different periods, the shifts for the different partnerships have differing calibrations. Hence ambiguities are thus resolved to increase the capture range.

FIG. 12 shows in boundary 80 the fringe interference patterns observed when the alignment marks of FIG. 8 are correctly superimposed, with no blocking of the spatial filters. The first pair of partner fringes is denoted by 81 and the second by 82. In boundary 90 is shown the fringe interference patterns observed when the alignment marks of FIG. 8 are correctly superimposed with one of the outer spatial filters blocked. Again, the same first pair of partner fringes is denoted by 91 and the second by 92. There are two motions observed: a relatively coarse en-masse shift of the fringes as a whole labeled 93 for the first fringe partnership and 94 for the second fringe partnership, and a relative offset of the fringes, labeled 94 for the first fringe partnership and 96 for the second fringe partnership. The observed shifts are proportional to the gap between mask and substrate, as well as having wavelength dependence and detailed grating-period dependence. In boundary 100 is shown the fringe interference patterns observed when the alignment marks of FIG. 8 are again correctly superimposed but with the other one of the outer spatial filters blocked. Equal motions as in 90 are now observed, but in the opposite direction. Again the same fringe partnerships are denoted by 101 and 102. The coarse bodily motions are denoted by 103 and 104, and the finer offsets by 105 and 106. The observed motions will yield the gap, on a coarse and on a fine scale. The motions may be calibrated using known gaps, or the algorithms may be readily determined by those skilled in the art. It should be noted that when one of the spatial filters is blocked, the broken symmetry also breaks the achromatic properties of the fringes, and there will be a limit on the bandwidth for successful measurement because of the fringe broadening. The limit will depend upon circumstances. It may be deduced by experiment, or readily calculated by those skilled in the art.

FIG. 13 is as FIG. 12, except that the mask and substrate are now misaligned. The pattern in boundary 110 with no blocking of spatial filters, shows offsets proportional to the misalignment. The first fringe partnership 111 has phase offset 113, and the second fringe partnership 112 has phase offset 114. The images in boundaries 120 and 130 correspond to first one of the outer spatial filters blocked, and then the other. The fringes of each fringe partnership are again displaced en-masse, by the same amount as when the substrate and mask were aligned in FIG. 12, and the same relative shifts also occur. The first fringe partnership moves en-masse a distance 104, and the second fringe partnership moves bodily a distance 105. The relative shifts change to 106 and 107, respectively. Similarly, in the image in boundary 130 the motions are in the opposite direction as before. If the gap is the same for both FIGS. 12 and 13, then distance 93=distance 104, distance 94=distance 105. distance 96=distance 104−distance 113. Similar relationships hold the other side, as will be clear to anyone skilled in the art, and it will be clear that the measurement of these fringe motions will yield both the alignment offset and the gap. The calibration constants for the en-masse and relative shifts can be modeled from theory or ascertained by calibration. It is part of the invention that the mask and substrate need not be aligned prior to the gap measurement. Regardless of alignment, the images of FIG. 13 will yield a measure of the alignment offset as well as a measure of the gap. The gap may be deduced, to different scales, from the en-masse and the relative shifts of the fringes between the images in boundaries 120 and 130. The alignment measurement is deduced by averaging the phase offsets of the images in boundaries 120 and 130. A further check of the alignment is obtained, if desired, from the relative shift in the image in boundary 110. However, note that a complete measurement of alignment and gapping can be obtained from only observing the images in boundaries 120 and 130. A further advantage of observing only the images in boundaries 120 and 130 is that it removes the possibility of error due to unintentional blazing of the alignment gratings. Such blazing could cause a small error in the phase offset showing the image in boundary 110, but would not be apparent in the images in boundaries 120 and 130. Again, this will be clear to anyone skilled in the art.

FIG. 14 illustrates, according to the invention, how all the alignment gratings on either the mask or substrate are periodically interrupted. This causes secondary diffraction in a plane perpendicular to the plane of diffraction that would be caused by the uninterrupted gratings. This secondary diffraction enables illumination and observation at an angle, or angles, inclined from the normal direction to the mask and substrate. The angle $\alpha$ between illumination and observation, will generally be zero for convenience in designing the optics, but need not be zero. The diffractions in the primary plane (now tilted by virtue of the secondary diffraction) are unchanged except for a) the geometrically increased gap because of the inclination of light paths, and b) a possible lengthening of the fringes in the image, if the illuminating spectral bandwidth is significant. The latter will result from the wavelength dependence of the secondary diffraction, and may cause colored ends for the fringes but will not adversely effect the measurements. An additional advantage of the invention is that, if the illumination consists of a series of relatively narrow spectral bands, with significant spectral separations, each spectral band will result in a complete separated image such as that of FIG. 12. Hence there will be as many images as spectral bands. The fringe motions for each image when the alternate spatial filters are blocked will then depend upon the color as well as on the gap, and hence will enable elimination of ambiguity in the same manner as obtained with the multiple gratings. This advantage can be used in conjunction with the multiple gratings for eliminating ambiguity in alignment and in gapping, or the advantages can be used separately.

FIG. 15 illustrates three geometries that achieve the off-normal illumination and observation of the fringe patterns. The plane of the figure is the secondary diffraction plane. All primary diffractions from the gratings take place in planes perpendicular to the plane of the paper. In each geometry, the angle $\alpha$ may be finite, or may reduce to zero. In boundary 140 and in boundary 150 the interrupted alignment mark is on the substrate. In boundary 160 it is on the mask. In boundary 140, the incoming light 141 experiences a single diffraction when it encounters the interrupted grating on the substrate 143, and returns on itself (Littrow configuration) or at angle $\alpha$ from its original direction. In boundary 150, the incoming light diffracts into a normal or near-normal direction when it encounters the interrupted grating on the substrate 153. It then reflects down again from the mask to be diffracted a second time to return along the path on which it came, or at an angle $\alpha$. In boundary 160, the incoming light diffracts downward from the interrupted grating on the mask 162, then is reflected upward to again be diffracted at the interrupted grating on the mask, to return along its arriving path, or at an angle $\alpha$. The arrangement in boundary 140 is preferred because there is less loss of light because it only experiences one diffraction in the secondary plane. However, the gratings on the substrate are liable to lose diffraction efficiency during lithographic processing. Hence, there may be circumstances in which the arrangement in boundary 160 is the preferred.

Referring to FIG. 16A, there is shown a checkerboard pattern on the second plate, typically the substrate, and FIG. 16B shows an interrupted-grating pattern on the second plate, typically the substrate. Either an amplitude-modulating or a phase-modulating pattern may be used for either pattern, or a hybrid modulation that is both amplitude and phase-modulation. The elements of the checkerboard pattern are preferably rectangular, but other shapes may be used with their centers arranged in a similar geometric pattern, even including a nonrectilinear pattern.

Referring to FIGS. 17A and 17B, there are shown two-dimensional discrete Amplitude Fourier Transforms of the checkerboard and interrupted grating patterns, respectively, of FIGS. 16A and 16B. In taking the transforms, each of the patterns of FIG. 16 is taken as having a total of 32 pixels horizontally and 16 vertically. In FIG. 17, only the first quadrant of each corresponding Fourier Transform is shown. i.e. 16 pixels horizontally and 8 vertically, with the origin at the upper left corner of each. The Fourier Transforms are both normalized in the same ratio. Any person ordinarily skilled in the arts of Fourier Transforms and Diffraction will recognize that these plots indicate the angles into which light can be diffracted by each pattern. In particular they show that under Littrow illumination, the checkerboard will return no light exactly upon itself, whereas the streets pattern will do so. The key to understanding this lies in the third row down of the pixels in each pattern, which correspond to one of the Littrow diffraction possibilities.

Referring to FIGS. 18A and 18B, there is shown a schematic representation indicating the paths of rays that interfere when the pattern on the second plate, or substrate, is the interrupted grating pattern of FIG. 16B, showing presence of pure zero-order light, and the checkerboard pattern of FIG. 16A, showing absence of pure zero-order light, respectively, when using Littrow angle diffraction at the second plate. The checkerboard pattern results in moiré-interference fringes of consistently higher contrast.

Referring to FIG. 19, there is shown a schematic representation illustrating the quasi-Michelson interferometer geometry with the grating on the first plate, or mask, acting as a dispersing beam-splitter so the light emerges in a fan-shape with angle a function of wavelength. The grating may be advantageously designed to eliminate second-order diffraction. One example is an amplitude grating with 50% filling. Other designs to eliminate second-order diffraction are evident to those having ordinary skill in the art of diffraction, including phase modulation patterns. An advantage of eliminating second-order diffraction is the avoidance of back-diffraction toward the observing optics at the first encounter with the grating, which would complicate the resulting moiré-interference fringes and reduce their contrast.

Referring to FIG. 20, there is shown a graphical representation of contours of equal intensity in the interference pattern as a function of gap and angle.

Referring to FIG. 21A and 21B, there are shown perpendicular cuts through the graphical representation of FIG. 20 showing cuts at constant wavelength but varying gap and at constant gap but varying wavelength, respectively. It is advantageous to use white illuminating light to furnish a continuous spectrum across the band of interest. The image of the interference pattern then yields a measure of the gap without any scanning of the gap.

In the case of a discontinuous spectrum, depending upon the extent of discontinuity, it may be advantageous to scan the gap and analyze images at more than one value of gap width. In some cases, it may be advantageous to image the emerging light upon a photodiode array, or even upon a single photodiode instead of an imaging camera. In some cases, it may be advantageous to introduce a beam-splitter in the viewing optics to allow imaging upon both a diode array or single diode while simultaneously imaging upon an imaging camera. In some cases, it may be advantageous to use the beam-splitter to divide the received light between two imaging cameras. This arrangement may be especially desirable considering that the same viewing optics may normally be used for both aligning and gap measurement functions.

Individual shuttering capability of all three spatial filter holes allows the gapping and aligning to use the same viewing optics.

It is obvious to anyone skilled in the art that the alignment methods described herein are not restricted to x-ray lithographic applications but may in fact be used in other forms of lithography, and also outside the field of lithography, in any applications where one movable plate is to be aligned with respect to another.

Other embodiments are within the claims.

What is claimed is:

1. An alignment apparatus far aligning first and second relatively movable plates, comprising:

on a face of each of said first and second plates, first and second alignment marks, respectively, each including a first set of linear gratings of parallel lines of uniform spatial period, the spatial periods of selected linear gratings on each plate being different from each other to form first and second pairs of linear grating patterns respectively;

on said face of each said first and second plates, each of said first and second alignment marks including at least a second set of linear gratings of parallel lines of uniform spatial period, selected spatial periods being different from each other to form third and fourth pairs of linear grating patterns, respectively, said third and fourth pairs of linear grating patterns being disposed parallel to said first and second pairs of linear grating patterns;

a light source for illuminating said pairs of linear gratings to produce at least first and second interference patterns having first and second spatial phases, respectively;

a detector configured to detect when at least said first and second spatial phases assume a predetermined difference in phase values; and a position adjuster for adjusting the relative position of said first and second plates until said detector detects the predetermined difference in phase values.

2. Alignment apparatus in accordance with claim 1 and further comprising, indicia on one of said first and second plates forming a periodic reference pattern having a reference spatial phase, said detector configured to detect when the spatial phase of said first interference pattern and the spatial phase of said second interference pattern differ from said reference spatial phase by a predetermined value.

3. Alignment apparatus in accordance with claim 1 and further comprising, indicia on one of said first and second plates forming a periodic reference linear grating pattern, wherein said first linear grating pattern has a spatial period $p_1$, said second linear grating pattern has a spatial period $p_2$, and said reference linear grating pattern lies adjacent to one of said first and second linear grating patterns and comprises a grating pattern of spatial period $p_3$ being equal to $p_1 \times p_2/|p_1-p_2|$.

4. Alignment apparatus in accordance with claim 1 wherein said first and second plates comprise a semiconductor substrate and lithography mask respectively.

5. Alignment apparatus in accordance with claim 1 wherein said detector includes an imaging sensor and controlled spatial filtering for inhibiting the transmission of unwanted light energy to said imaging sensor.

6. Alignment apparatus in accordance with claim 1 wherein said gratings are formed with spaces in their lines to form a secondary grating with period $p_s$ to cause a secondary diffraction in a plane perpendicular to the primary diffraction to define light paths between the light source and detector at angles different from the normal to said plates so that the exposure area between said plates is free of optics.

7. Alignment apparatus in accordance with claim 1 and further comprising, on said face of each said second plates a checkerboard pattern, said light source illuminating said checkerboard pattern.

8. A method of aligning first and second relatively movable plates, the first plate including a first alignment mark comprising a first pair of linear grating patterns having a first set of spatial periods and a second pair of linear grating patterns having a second set of spatial periods, and the second plate including a second alignment mark comprising a third pair of linear grating patterns having a third set of spatial periods different from said first set of spatial periods and a fourth pair of linear grating patterns having a fourth set of spatial periods different from said second set of spatial periods, said method comprising:

illuminating the first and third pairs of grating patterns to form at least a first interference pattern therebetween having a first spatial phase;

illuminating the second and fourth pairs of grating patterns to form at least a second interference pattern therebetween having a second spatial phase; and adjusting the relative position of said first and second plates until said first spatial phase and said second spatial phase assume a predetermined spatial phase difference.

9. A method of aligning first and second relatively movable plates in accordance with claim 8 wherein said second plate includes a checkerboard grating pattern and further including, illuminating said checkerboard pattern to form an interference pattern over interfering paths following diffraction that is free of the pure zero-order beam.

10. An alignment apparatus for aligning first and second relatively movable plates, comprising:

on a face of each of said first and second plates, first and second alignment marks, respectively, each including a first set of linear gratings of parallel lines of uniform spatial period, the spatial periods of selected linear gratings on each plate being different from each other to form first and second pairs of linear grating patterns, respectively;

on said face of each said first and second plates, each of said first and second alignment marks including at least a second set of linear gratings of parallel lines of uniform spatial period, selected spatial periods being different from each other to form third and fourth pairs of linear grating patterns, respectively, said third and fourth pairs of linear grating patterns being disposed parallel to said first and second pairs of linear grating patterns;

a light source for illuminating said first, second, third and fourth pairs of linear gratings to produce first, second, third and fourth interference patterns, respectively, having first, second, third and fourth spatial phases, respectively;

a detector configured to detect when said first and second spatial phases assume a first predetermined difference in phase values, and to detect when said third and fourth spatial phases assume a second predetermined difference in phase values; and a position adjuster for adjusting the relative position of said first and second plates until said detector detects the first and second predetermined differences in phase values.

11. An alignment apparatus for aligning first and second relatively movable plates, comprising:

on a face of each of said first and second plates, first and second alignment marks, respectively, each including a linear grating of parallel lines of uniform spatial period, the spatial periods being different from each other to form first and second linear grating patterns, respectively;

on said face of each said first and second plates, at least third and fourth linear gratings of parallel lines of uniform spatial period associated with said first and second alignment marks, respectively, the spatial periods of said third and fourth linear gratings being different from each other to form third and fourth linear grating patterns, respectively;

indicia on one of said first and second plates forming a periodic reference pattern having a reference spatial phase;

a light source for illuminating said linear gratings to produce at least first and second interference patterns having first and second spatial phases, respectively;

a detector configured to detect when said first and second spatial phases assume a predetermined difference in phase values, said detector configured to detect when the spatial phase of said first interference pattern and the spatial phase of said second interference pattern differ from said reference spatial phase by a predetermined value; and a position adjuster for adjusting the relative position of said first and second plates until said detector detects the predetermined difference in phase values.

12. An alignment apparatus for aligning first and second relatively movable plates, comprising:

on a face of each of said first and second plates, first and second alignment marks, respectively, each including a linear grating of parallel lines of uniform spatial period, the spatial periods being different from each other to form first and second linear grating patterns, respectively;

on said face of each said first and second plates, at least third and fourth linear gratings of parallel lines of uniform spatial period associated with said first and second alignment marks, respectively, the spatial periods of said third and fourth linear gratings being different from each other to form third and fourth linear grating patterns, respectively;

indicia on one of said first and second plates forming a periodic reference linear grating pattern;

a light source for illuminating said linear gratings to produce at least first and second interference patterns having first and second spatial phases, respectively;

a detector configured to detect when said first and second spatial phases assume a predetermined difference in phase values; and a position adjuster for adjusting the relative position of said first and second plates until said detector detects the predetermined difference in phase values, wherein said first linear grating pattern has a spatial period $p_1$, said second linear grating pattern has a spatial period $p_2$, and said reference linear grating pattern lies adjacent to one of said first and second linear grating patterns and comprises a grating pattern of spatial period $p_3$ being equal to $p_1 \times p_2/|p_1-p_2|$.

13. An alignment apparatus for aligning first and second relatively movable plates, comprising:

on a face of each of said first and second plates, first and second alignment marks, respectively, each including a linear grating of parallel lines of uniform spatial period, the spatial periods being different from each other to form at least first and second linear grating patterns, respectively;

a light source for illuminating said linear gratings to produce at least first and second interference patterns having first and second spatial phases, respectively;

a detector configured to detect when said first and second spatial phases assume a predetermined difference in phase values, said detector including an imaging sensor and controlled spatial filtering for inhibiting the transmission of unwanted light energy to said imaging sensor; and a position adjuster for adjusting the relative position of said first and second plates until said detector detects the predetermined difference in phase values.

14. An alignment apparatus for aligning first and second relatively movable plates, comprising:

on a face of each of said first and second plates, first and second alignment marks, respectively, each including first and second linear gratings of parallel lines of uniform spatial period, the spatial periods being different from each other to form first and second linear grating patterns, respectively;

light source for illuminating said linear gratings to produce at least first and second interference patterns having first and second spatial phases, respectively;

a detector configured to detect when said first and second spatial phases assume a predetermined difference in phase values; and a position adjuster for adjusting the relative position of said first and second plates until said detector detects the predetermined difference in phase values, wherein selected gratings are formed with spaces in their lines to form a secondary grating with period $p_s$ to cause a secondary diffraction in a plane perpendicular to the primary diffraction to define light paths between the light source and detector at angles different from the normal to said plates so that the exposure area between said plates is free of optics.

15. A set of alignment marks used for aligning first and second relatively movable plates, comprising first and second alignment marks respectively disposed on a face of each of said first and second plates, each of said first and second alignment marks including a first set of linear gratings of parallel lines of uniform spatial period, the spatial periods of selected linear grating being different from each other to form first and second pairs of linear grating patterns, respectively, and each of said first and second alignment marks including at least a second set of linear gratings of parallel lines of uniform spatial period, the spatial periods of selected gratings being different from each other to form third and fourth pairs of linear grating patterns, respectively, said third and fourth pairs of linear grating patterns being disposed parallel to said first and second pairs of linear grating patterns, wherein said pairs of linear gratings are illuminated to produce at least first and second interference patterns having first and second spatial phases, respectively, so that the occurrence of a predetermined difference in phase values between said first and second spatial phases can be detected.

* * * * *